US010732250B2

(12) United States Patent
Nerheim et al.

(10) Patent No.: US 10,732,250 B2
(45) Date of Patent: Aug. 4, 2020

(54) SYSTEMS AND METHODS FOR CALIBRATING A TESTER FOR A CONDUCTED ELECTRICAL WEAPON

(71) Applicant: Axon Enterprise, Inc., Scottsdale, AZ (US)

(72) Inventors: Magne H. Nerheim, Scottsdale, AZ (US); Eric H. Goodchild, Scottsdale, AZ (US)

(73) Assignee: Axon Enterprise, Inc., Scottsdale, AZ (US)

( * ) Notice: Subject to any disclaimer, the term of this patent is extended or adjusted under 35 U.S.C. 154(b) by 185 days.

(21) Appl. No.: 15/678,736

(22) Filed: Aug. 16, 2017

(65) Prior Publication Data

US 2018/0284214 A1  Oct. 4, 2018

Related U.S. Application Data

(60) Provisional application No. 62/478,764, filed on Mar. 30, 2017.

(51) Int. Cl.
*G01R 29/24* (2006.01)
*G01R 35/00* (2006.01)
*F41H 13/00* (2006.01)

(52) U.S. Cl.
CPC .......... *G01R 35/005* (2013.01); *G01R 29/24* (2013.01); *F41H 13/0025* (2013.01)

(58) Field of Classification Search
CPC .. G01R 31/3191; G01R 35/005; G01R 35/00; G01R 29/24; F41H 13/0025; F41H 13/0012
USPC ..................................... 324/601–678, 750.02
See application file for complete search history.

(56) References Cited

U.S. PATENT DOCUMENTS

| | | | | | |
|---|---|---|---|---|---|
| 5,060,131 | A | * | 10/1991 | Sikora | H02M 3/33507 363/21.09 |
| 5,879,374 | A | * | 3/1999 | Powers | A61N 1/3931 607/5 |
| 6,191,723 | B1 | * | 2/2001 | Lewis | G01R 27/2605 324/677 |

(Continued)

FOREIGN PATENT DOCUMENTS

| | | |
|---|---|---|
| JP | 2002296556 A | 10/2002 |
| WO | 97017829 A1 | 5/1997 |
| WO | 2005094228 A2 | 10/2005 |

OTHER PUBLICATIONS

International Searching Authority, International Search Report for the International Patent Application No. PCT/US2017/047186 dated Dec. 22, 2017.

*Primary Examiner* — Melissa J Koval
*Assistant Examiner* — Courtney G McDonnough
(74) *Attorney, Agent, or Firm* — Lawrence Letham (57) ABSTRACT

Systems and methods for calibrating a tester that is used to calibrate conducted electrical weapons ("CEWs"). Providing a known magnitude of current for a calculated amount of time to a measurement capacitor stores a known amount of charge on the capacitor. The voltage corresponding to the known charge can be used to measure the amount of charge provided by a pulse of a stimulus signal while calibrating a CEW. A real-time clock may be used to ensure the accuracy of the time measurements over long time periods. Accurate measurement of resistors in a load circuit provides further tester accuracy.

16 Claims, 8 Drawing Sheets

(56) References Cited

U.S. PATENT DOCUMENTS

| | | | |
|---|---|---|---|
| 2006/0043956 A1* | 3/2006 | Clavette | H02M 3/156 |
| | | | 323/288 |
| 2007/0194795 A1 | 8/2007 | Amanuma et al. | |
| 2011/0040515 A1 | 2/2011 | Miller et al. | |
| 2013/0049758 A1* | 2/2013 | Burns | F41A 17/063 |
| | | | 324/403 |

\* cited by examiner

SYSTEMS AND METHODS FOR CALIBRATING A TESTER FOR A CONDUCTED ELECTRICAL WEAPON

FIELD OF THE INVENTION

Embodiments of the present invention relate to a tester for a conducted electrical weapon ("CEW").

BRIEF DESCRIPTION OF THE DRAWING

Embodiments of the present invention will be described with reference to the drawing, wherein like designations denote like elements, and.

DETAILED DESCRIPTION OF THE PREFERRED EMBODIMENTS

A conducted electrical weapon ("CEW") is a device that provides a stimulus signal through a human or animal target. A stimulus signal inhibits locomotion of the target. Locomotion may be inhibited by interfering with voluntary use of skeletal muscles and/or causing pain in the target. A stimulus signal that interferes with skeletal muscles causes the skeletal muscles to lockup (e.g., freeze, tighten, stiffen) so that the target may not voluntarily move.

A CEW may include a handle and a deployment unit (e.g., cartridge). A handle may include the circuitry for producing the stimulus signal. A handle may include terminals for providing the stimulus signal to a target by drive stun in which the terminals are brought proximate to target tissue to provide the current. A deployment unit may be removably coupled to a handle to provide a remote stun. To provide a remote stun, the handle provides a signal to the deployment unit to launch wire-tethered electrodes toward the target to be positioned proximate to target tissue. The handle provides the stimulus signal to the target via the wire-tethered electrodes. A deployment unit may be inserted into a bay of the handle for use to provide a remote stun. The used (e.g., fired) deployment unit may be removed from the bay and a new (e.g., unused) deployment unit inserted into the bay for use. A handle may include one or more bays for receiving respective deployment units.

A stimulus signal may be more effective at causing skeletal muscle to lock up if a minimum amount of charge is provided by the stimulus signal into target tissue. A stimulus signal may include a series of pulses. Each pulse of the stimulus signal provides an amount of charge through the target. The pulses are delivered at a pulse rate. Providing a predetermined amount of charge or about the same as (e.g., close to) a predetermined amount of charge per pulse may improve the effectiveness of the stimulus signal in impeding the locomotion of the target. Providing the predetermined amount of charge, or close thereto, by each pulse of the stimulus signal may increase the likelihood of locking up the skeletal muscle of the target to impede locomotion of the target.

A pulse of a stimulus signal may be referred to as a pulse of current.

Figure 1:
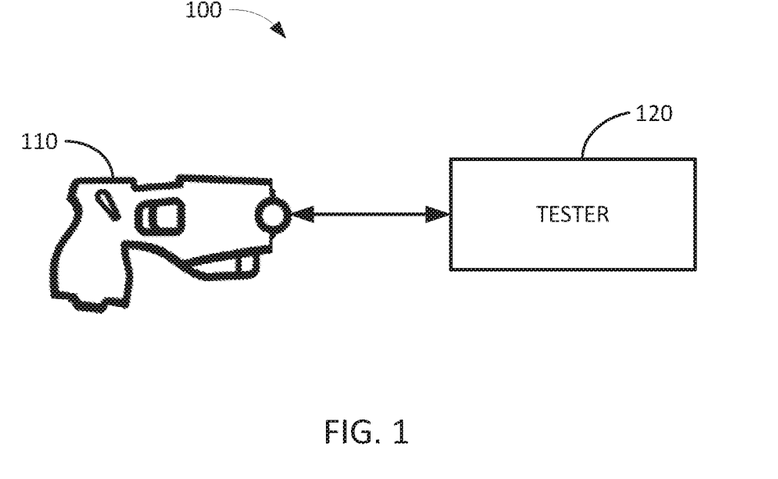
FIG. 1 is a functional block diagram of a system that creates an environment (e.g., ecosystem) for a CEW to cooperate with a tester according to various aspects of the present disclosure.

A CEW may require periodic calibration to increase the likelihood that the CEW provides the predetermined amount of charge per pulse. For example, CEW handle 110 may cooperate with tester 120 in ecosystem 100 to calibrate (e.g., measure, adjust, standardize) the amount of charge provided by a pulse of a stimulus signal, as shown in FIG. 1. A CEW may adjust (e.g., change, increase, decrease) the charge delivered by one or more pulses of a stimulus signal.

During calibration, CEW handle 110 may produce a single pulse of the stimulus signal. Tester 120 receives the single pulse of the stimulus signal and measures the amount of charge provided by the pulse. Tester 120 may present (e.g., provide) different loads (e.g., impedance, resistance) to the CEW into which the pulse is delivered. Tester 120 may report the amount of charge that it measured for the pulse to CEW handle 110. CEW handle 110 may adjust the amount of charge provided by a next pulse of the stimulus signal responsive to the report from tester 120. This process may continue until CEW handle 110 provides the predetermined amount of charge, or close thereto, in each pulse of the stimulus signal. Tester 120 may further report the amount of charge measured to a user through a user interface.

The methods and systems for calibrating a CEW are more fully disclosed in U.S. patent application Ser. No. 15/299,226 filed Oct. 20, 2016, which is hereby incorporated by reference for all purposes.

A tester may be periodically calibrated using accurate measurements, as described herein, to ensure the amount of charge as measured by the tester is correct (e.g., accurate). The measurements made during calibration of the tester are used to ascertain whether the circuits of the tester accurately determine the amount of charge delivered by the CEW with each pulse. Accuracy is determined as to whether a pulse delivers a predetermined amount of charge.

Calibration of the tester may be performed in cooperation with an external source of a reference current. The magnitude of the current may be measured by an external digital multimeter. This method of calibration may be referred to as external source—external measurement ("ESEM") calibration. As described herein, a measured magnitude of current may be applied to the tester to determine the time for a predetermined amount of charge to accumulate on a capacitor.

Calibration of the tester may be performed using an internal source of current. The magnitude of current from the internal source may be measured with an external multimeter. This method of tester calibration may be referred to as internal source—external measurement ("ISEM") calibration. As described herein, a measured magnitude of current supplied by a source within the tester may be used to determine the time for a predetermined amount of charge to accumulate on a capacitor.

Calibration of the tester may be performed using an internal source of current. The magnitude of current from the internal source may be known, thus eliminating the need for an external measurement. The magnitude of current may be a single value or may be a set to a known value by a processor. This method of calibration may be referred to as internal source—no measurement ("ISNM") calibration.

Calibration verification may be performed by the tester to ensure the tester is operating within its calibration. A calibration verification may be performed without user input. As described herein, calibration verification may use stored values to ascertain that the tester is within specified operating parameters. Calibration verification may be performed upon powering on the tester. Calibration verification made be performed prior to testing each CEW or after a number of CEWs have been tested.

A tester may provide a message regarding the amount of charge measured by the tester for a pulse of the stimulus signal. A CEW may receive the message regarding the amount of charge measured by the tester. A CEW may use the information from the message regarding the amount of charge provided by the pulse to calibrate amount of charge delivered by the pulses of a stimulus signal to provide a predetermined amount of charge with each pulse.

A tester may maintain a log (e.g., record) of charge measured for each pulse provided by a CEW. A CEW may provide an identifier (e.g., serial number) that uniquely identifies the CEW. The identifier may be stored in the log with the information as to the measurements made.

Figure 2:
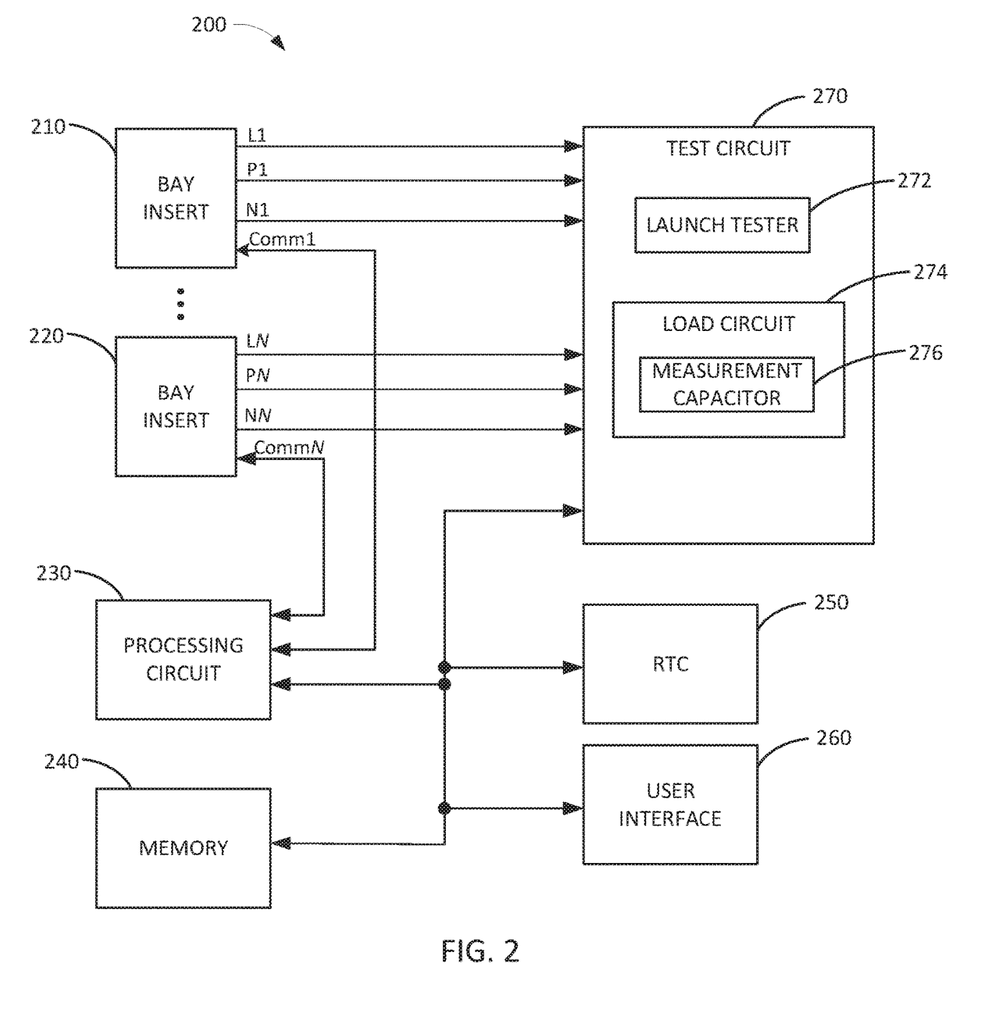
FIG. 2 is a functional block diagram of an implementation of the tester of FIG. 1.

Tester 200 of FIG. 2 is an implementation of tester 120. Tester 200 performs the functions of a tester and/or tester 120 discussed above and herein. Tester 200 may include bay insert 210 and 220, processing circuit 230, memory 240, real-time clock ("RTC") 250, user interface 260, and test circuit 270. A test circuit may include launch tester 272, and load circuit 274. Load circuit 274 may include measurement capacitor 276. Test circuit 270 may further include a circuit (e.g., bay detector) for detecting which bay of the CEW handle provides a pulse of the stimulus signal. Tester 200 may include a power supply (not shown) for supplying power (e.g., energy) to the tester for performing the functions of a tester.

A bay insert is a plug (e.g. male fitting) of the tester that may be inserted into a bay (e.g., female receptacle, socket) of a CEW handle. The bay receives and at least partially contains the plug. A bay insert may be placed into a bay during calibration. A bay insert may include conductors (e.g., terminals). A bay may include conductors. Inserting a bay insert into a bay electrically couples the conductors of the bay insert to the conductor of the bay.

For example, bay insert 210 includes conductors L1 (e.g., launch 1), P1 (e.g., positive stimulus 1), and N1 (e.g., negative stimulus 1). A first bay (not shown) of CEW handle 110 has corresponding conductors. Bay insert 220 includes conductors LN (e.g., launch N), PN (e.g., positive stimulus N), and NN (e.g., negative stimulus N). A second bay (not shown) of CEW handle 110 has corresponding conductors. Electrical signals (e.g. L1, P1, N1, LN, PN, NN) may be differential or referenced to a common ground. Inserting a bay insert into a bay electrically couples the signals of the bay insert to the corresponding conductors in the bay. A bay insert and a bay may further include one or more conductors that electrically couple the tester to the handle so that the handle may communicate with the tester.

A processing circuit includes any circuitry and/or electrical/electronic subsystem for performing a function. A processing circuit may include circuitry that performs (e.g., executes) a stored program. A processing circuit may include a digital signal processor, a microcontroller, a microprocessor, an application specific integrated circuit, a programmable logic device, logic circuitry, state machines, MEMS devices, signal conditioning circuitry, communication circuitry, a conventional computer (e.g., server), a conventional radio, a network appliance, data busses, address busses, and/or a combination thereof in any quantity suitable for performing a function and/or executing one or more stored programs.

A processing circuit may further include conventional passive electronic devices (e.g., resistors, capacitors, inductors) and/or active electronic devices (op amps, comparators, analog-to-digital converters, digital-to-analog converters, current sources, programmable logic). A processing circuit may include conventional data buses, output ports, input ports, timers, memory, and arithmetic units.

A processing circuit may provide and/or receive electrical signals whether digital and/or analog in form. A processing circuit may provide and/or receive digital information (e.g., data) via a conventional bus using any conventional protocol. A processing circuit may receive information, manipulate the received information, and provide the manipulated information. A processing circuit may store information and retrieve stored information. Information received, stored, and/or manipulated by the processing circuit may be used to perform a function and/or to perform a stored program.

A processing circuit may communicate with and/or control the operation and/or function of other circuits and/or components of a system. A processing circuit may receive status information regarding the operation of other components, perform calculations with respect to status information, and provide commands (e.g., instructions) to one or more other components, for example, for the component to start operation, continue operation, alter operation, suspend operation, or cease operation. Commands and/or status may be communicated between a processing circuit and other circuits and/or components via any type of bus including any type of conventional data/address bus.

For example, processing circuit 230 may communicate with and/or control bay inserts 210 and 220. Processing circuit 230 may also communicate and/or control memory 240, test circuit 270, RTC 250, and user interface 260. The communication may be accomplished via any conventional data and/or control bus. The communication may be via point-to-point communication pathways.

A processing circuit may include a power supply for providing (e.g., sourcing, generating) a constant (e.g., independent) flow of current (e.g., constant current source). The magnitude of current (e.g., amperes) may be programmable by the processing circuit. A predetermined magnitude of current may be supplied by the processing circuit.

A processing circuit may include a sample-and-hold circuit ("SHC") that samples (e.g., captures, grabs) a magnitude of the voltage of a varying analog signal and holds (e.g., locks, freezes) its value of the magnitude of the voltage at a constant level for a specified minimum period of time.

A processing circuit may include an analog-to-digital converter ("ADC"). An ADC may convert an analog signal (e.g., voltage) into a digital representation (e.g., binary) that corresponds to a magnitude of the analog signal. An ADC may cooperate with a SHC to convert a magnitude of a sampled analog signal to a digital representation (e.g., form).

The digital representation of the sampled analog signal may be manipulated by the processing circuit.

Processing circuit 230 performs the function of a processing circuit discussed above.

A memory stores electronic information. A memory provides previously stored information. A memory may provide previously stored information responsive to a request for information. A memory may store information in any conventional format. A memory may store electronic digital information. A memory may store information organized in a data structure and/or database.

A memory includes any semiconductor, magnetic, optical technology, or any combination thereof for storing information. A memory may receive information from a processing circuit for storage. A processing circuit may provide a memory a request for previously stored information. Responsive to the request, the memory may provide stored information to a processing circuit. A memory may include a collection (e.g., group, system, hierarchy) of memories that cooperate to store, organize, and/or retrieve information.

A memory includes any digital circuitry for storing program instructions and/or data. Storage may be organized in any conventional manner (e.g., program code, data, buffer, circular buffer, data structure). Memory may be incorporated in and/or accessible by a transmitter, a receiver, a transceiver, a sensor, a controller, an RTC, a user interface, and/or a processing circuit.

For example, memory 240 performs the functions of a memory as discussed above.

An RTC (e.g., a time reference) counts (e.g., measures, tracks) time. An RTC may track time with reference to Coordinated Universal Time ("UTC"), Greenwich Mean Time ("GMT"), and/or a local time zone. An RTC may provide a present time and/or a date. An RTC may be initialized (e.g., set to an initial time) during manufacture. The RTC may be initialized when a tester is calibrated. A user may initialize the RTC. A processing circuit may receive a present time and/or date from an RTC. A present time and/or date from an RTC may be used as a time-stamp to mark (e.g., identify) an operation and/or event. A processing circuit may store a time-stamp along with information in a memory. Information in a log may include a time-stamp. A log may include respective entries for information stored. Each entry may include a time-stamp that represents the time of occurrence of the event recorded in the entry and/or the time of storing the entry in the log.

A processing circuit may measure (e.g., detect) an elapsed time using the present time from an RTC. An RTC may provide the present time of the start of a duration (e.g., period) of time. An RTC may provide the present time at the end of the duration of time. A processing circuit may calculate the difference in the start time and the end time to determine the duration of the elapse of time. An RTC may include a timer that counts up or counts down to track a duration of time. An RTC may provide a signal at the end of counting up or counting down to mark (e.g., indicate) the end of a duration of time measured by the counter.

An RTC may be implemented with an integrated circuit (e.g., semiconductor) that increments its time (e.g., counter) in accordance with a clock (e.g., crystal, oscillator, radio signal, GPS). With many crystals, the frequency of the crystal varies little (e.g., 0.50 ppm) over the temperature range of operation of the crystal, so that the tracking of time by the RTC is highly accurate regardless of the temperature of the circuit. Accurate tracking of time over temperature permits the RTC and/or the RTC in cooperation with the processing circuit to accurately measure a duration of time regardless of temperature variations.

A user may check the check the drift (e.g., accuracy) of an RTC by comparing the present time provided by the RTC with the present time provide by another source. A difference in time between the RTC and the other source may indicate that the clock drift of the RTC has exceeded an acceptable tolerance.

RTC 250 performs the functions and/or operations of an RTC as described above.

A user interface provides an interface between a user and a tester. A user interface enables communication between a user and a tester. A tester may provide information to a user via the user interface. A user may provide information to a tester via the user interface. A tester may visual and/or audible information to a user via the user interface. A user interface may include devices (e.g., LCDs, LEDs, light sources, graphical and/or textual display, display, monitor, touchscreen) that visually provide information to a user. A tester may include devices (e.g., controls, switches, touchscreen) that provide information to a tester responsive to an action by the user. A user may provide information to a tester via the controls of a user interface to control (e.g., influence) the operation (e.g., functions) of the tester.

A user interface may include a communication circuit for transmitting information to an electronic device for presentation to a user. For example, a user interface may wirelessly transmit information to a smart phone for presentation to a user. A user interface may include voice to text or convert audible commands from the user to instructions to a processing circuit so that a user may provide audible information to a tester via the user interface.

User interface 260 performs the functions of a user interface as described above.

A test circuit receives signals from a handle of a CEW. The signals may include one or more pulses of a stimulus signal and/or signals used by a handle of a CEW to launch electrodes from a deployment unit. A test circuit in cooperation with a processing circuit may measure (e.g., determine, detect) and record (e.g., store) characteristics (e.g. pulse width, voltage, current, average current, and charge) of a pulse provided by a handle. A test circuit may further measure and/or record the shape of one or more pulses (e.g., signal) over time. A test circuit may further detect and report the bay insert (e.g. bay insert 210, 220) and the signals (e.g. L1, LN, P1, PN, N1, NN) associated with each bay insert that received the pulse from the handle.

A test circuit may include a load circuit. A load circuit may present a load (e.g., impedance, resistance) to a CEW handle. The amount (e.g., magnitude of impedance, magnitude of resistance) of the load presented to the handle may be selectable. A selected load may be presented to a handle during testing and calibration of the handle. The load presented to the signals used to launch electrodes from a deployment unit may or may not be selectable.

Figure 3:
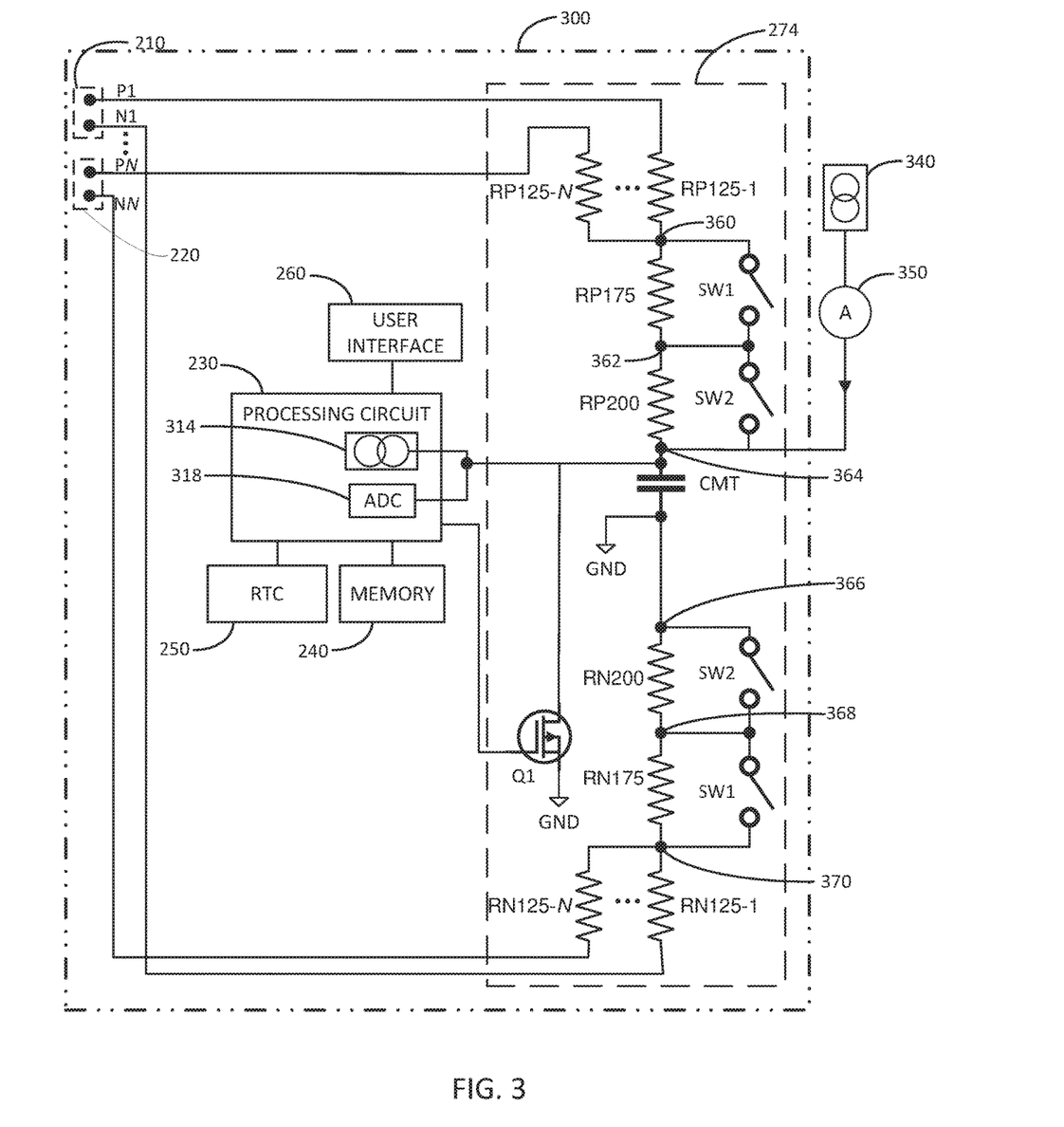
FIG. 3 is a diagram of an implementation of a portion of the test circuit of FIG. 2, an external current source, and an ammeter for calibrating the tester.

In an implementation of portions of tester 200, shown in FIG. 3, load circuit 274 includes resistors RP125-1, RP125-N, RP175, and RP200 for receiving the positive (e.g., non-negative) portion of a stimulus pulse provided via bay insert 210 or 220 and resistors RN125-1, RN125-N, RN175, and RN200 for receiving the negative portion of the stimulus pulse provided via bay insert 210 and 220. The nominal (e.g., specified) values of the resistors RP125/RN125, RP175/RN175, and RP200/RN200 are 125 ohms, 175 ohms and 200 ohms respectively. Switches SW1 and SW2 are controlled by processing circuit 230 at the request of the CEW handle 110 to set the load impedance seen by the CEW handle 110 to approximately 250 ohms, 600 ohms, or 1,000 ohms. Switches SW1 and SW2 may be electromechanical and/or solid-state relays. Switches SW1 and SW2 may be implemented using semiconductor (e.g., transistors) switches.

The actual value of a resistor may vary from its nominal specified value. The variation in the impedance of a resistor may occur as a result of temperature, manufacturing, use, and/or aging of the resistor. The tolerance of the resistors in load circuit 274 may typically be within ±1% of specified nominal value. Accurately measuring the charge provided by a pulse of a stimulus signal requires that processing circuit 230 know, typically to within ±1%, the actual values of the resistors of load circuit 274. The actual resistance of the resistors of load circuit 274 may be measured using an ohmmeter and/or digital multimeter that performs resistance/impedance measurements. The magnitude of the resistance of resistor RP125-1 may be determined by measuring the resistance between P1 of bay insert 210 and test point ("TP") 360. Table 1 below shows the nodes that may be used to measure the actual value of a particular resistor. The actual value of the resistor is determined by measuring the resistance/impedance between the nodes. Test points may be accessed through ports on the housing of a tester.

TABLE 1

Resistor Measurement Nodes

| Resistor | Nodes for Measuring |
|---|---|
| RP125-1 | P1 and TP360 |
| . | . |
| . | . |
| . | . |
| RP125-N | PN and TP360 |
| RP175 | TP360 and TP362 |
| RP200 | TP362 and TP364 |
| RN200 | TP366 and TP368 |
| RN175 | TP368 and TP370 |
| RN125-1 | N1 and TP370 |
| . | . |
| . | . |
| . | . |
| RN125-N | NN and TP370 |

The measured values of the resistors are provided by a user to processing circuit 230 through user interface 260. A user may inform processing circuit 230 of a measured resistor value by incrementing or decrementing a value displayed by user interface 260. A user may set the resistance values displayed by user interface 260 using any conventional control of user interface 260. Processing circuit 230 may store the measured resistor values in memory 240 and provide the resistor values in a log, along with the date and/or time the measurements were made.

Processing circuit 230 may provide the measured resistor values to a handle of a CEW during calibration of the handle. For example, communications between a handle and processing circuit 230 bay be accomplished through bay insert 210 via Comm1. The handle may use the supplied resistor values to compute the voltage needed to deliver a predetermined amount of charge to the tester.

Processing circuit 230 may also compare the measured values of each resistor with stored acceptable limits. For example, if any of the measured resistor values exceed the nominal value by ±5%, a message may be provided to the user that the tester is not within calibration limits and needs factory recalibration.

A load circuit may further include a capacitor referred to herein as a measurement capacitor. A measurement capacitor may receive and store an electric charge. A measurement capacitor may receive charge from a pulse of a stimulus signal. A measurement capacitor may store all or a portion of the charge provided by a pulse of a stimulus signal. A voltage across a measurement capacitor may be related (e.g., proportional) to the amount of charge provided by a pulse of a stimulus signal. A processing circuit may measure (e.g., detect, sense) the voltage across a measurement capacitor. A processing circuit may have knowledge of a value of the capacitance of a measurement capacitor. In accordance with the voltage measured across a measurement capacitor (V) and a knowledge of a value of the capacitance of the measurement capacitor (C), a processing circuit may determine (e.g., compute, calculate) an amount of charge (Q) stored on the measurement capacitor (Q=C·V).

In an implementation of portions of tester 200, shown in FIG. 3, the load circuit includes measurement capacitor CMT. Measurement capacitor CMT may be a single capacitor (e.g., capacitance). Measurement capacitor CMT may include multiple capacitors connected in parallel, in series, or in any combination of series and parallel connections. A magnitude of the capacitance of measurement capacitor CMT may be in the range of from 44 microfarads to 47 microfarads.

The charge stored on measurement capacitor CMT after test circuit 270 has received a pulse of the stimulus signal from CEW handle 110 represents the amount of charge provided by the pulse. Processing circuit 230 may measure the voltage across measurement capacitor CMT at TP 364. Processing circuit 230 may use the voltage measured across measurement capacitor CMT to calculate the charge provided by the pulse and stored on measurement capacitor CMT. The amount of charge provided by the pulse, as measured across measurement capacitor CMT, may be reported to the CEW.

Prior to receiving a next pulse from CEW handle 110, processing circuit 230 may close (e.g., allow current to flow through) switch Q1 to discharge measurement capacitor CMT. Discharging measurement capacitor CMT removes the charge stored on measurement capacitor CMT from a previous pulse and prepares measurement capacitor CMT to store the charge from a next pulse of the stimulus signal. After sufficient time for all of the charge to be discharged from measurement capacitor CMT, processing circuit 230 opens switch Q1.

Switch Q1 may be a semiconductor (e.g., transistor, BJT, FET, thyristor) switch. Switch Q1 may be an electromechanical or solid-state relay. Switch Q1 may be implemented with any conventional active electronic devices.

The capacitance of measurement capacitor CMT may vary over time, temperature, voltage, and with aging, thus affecting the accuracy of measuring the charge provided by a pulse of the stimulus signal from CEW handle 110. For example, the capacitance of an X7R ceramic capacitor (e.g., dielectric, chip capacitor) may vary by ±15% from its nominal value over its specified −55° C. to +125° C. operating range.

The charge on a capacitor may be determined using equation no. 1 provided below.

$$Q = i * t \qquad \text{Equation No. 1:}$$

where Q is the charge in coulombs, i represents the current in amperes, and t is time in seconds. A predetermined charge can be placed on a capacitor by applying a current of known magnitude for a predetermined amount of time.

As discussed above, the voltage across a capacitor may be determined using equation no. 2 below.

$$V = (Q/C)$$ Equation No. 2:

where V is measured in volts, and C is the capacitance of the capacitor in farads. The capacitance of a capacitor does not vary substantially over short durations of time, so the magnitude of the capacitance of a capacitor may be assumed to constant during testing of one or more CEWs. Therefore, providing a predetermined charge via a pulse of a stimulus signal to a measurement capacitor results in a known voltage across the measurement capacitor. The voltage across measurement capacitor CMT that corresponds to the predetermined amount of charge is referred to as the golden voltage. So, while the same environmental conditions prevail, each time processing circuit 230 measures the golden voltage across measurement capacitor CMT, the amount of charge provided by the pulse of the stimulus signal and stored on the measurement capacitor CMT is about the same as predetermined amount of charge.

Knowing the actual capacitance of measurement capacitor CMT is important to determining the amount of charge delivered by each pulse of a stimulus signal, so the tester 200, as shown in FIG. 3, is configured to enable measurement of the capacitance of measurement capacitor CMT while tester 200 is being calibrated.

Referring to portion 300 of tester 200 in FIG. 3, measuring the magnitude of the capacitance of measurement capacitor CMT is performed in cooperation with power supply 340 and ammeter 350 to provide ESEM calibration.

A power supply provides power (e.g., energy). For calibrating tester 200, power supply 340 provides electrical power. Power supply 340 may provide a current to charge measurement capacitor CMT of tester 200. The current from power supply 340 may be provided as a direct current ("DC") at a uniform rate (e.g., constant current source).

Ammeter 350 performs the function of an ammeter as described herein. An ammeter (e.g., milliammeter, microammeter) measures a magnitude of current. An ammeter may include a display that shows the magnitude of the current that flows between the terminals of the ammeter. Controls on the ammeter may set a range of the current to be measured. An ammeter may be included in a digital voltmeter ("DVM"), digital multimeter ("DMM"), volt-ohm-milliammeter ("VOM"), or other conventional device for measuring electrical properties.

The current provided by power supply 340 flows through ammeter 350. Ammeter 350 measures the magnitude of the current provided by power supply 340. Ammeter 350 presents the magnitude of the measured current on a display for viewing by a user. A user may report the value of the current as measured by ammeter 350 to tester 200 via user interface 260.

In an implementation, user interface 260 include a display and two switches. Processing circuit 230 presents on the display the magnitude of the current that has last reported by the user. If the magnitude of the current displayed by processing circuit 230 is not the same as the magnitude of the current measured and displayed by ammeter 350, the user operates one switch to inform processing circuit 230 that the current as measured by ammeter 350 is higher and the other switch to inform processing circuit 230 that the current as measured by ammeter 350 is lower. The user operates the switches until the magnitude displayed by processing circuit 230 is the same as the magnitude reported by ammeter 350. In this manner, the user reports to processing circuit 230 the value of the current being provided by power supply 340 and processing circuit 230 confirms receipt of the value by presenting the value on the display of user interface 260. The magnitude of the current reported by the user may be recorded in memory 240 by processing circuit 230.

In another implementation, the user may inform processing circuit 230 that the measured current is higher or lower than the display current through a rocker or a paddle switch. For example, the user may depress or move a lever to one side of the switch to inform processing circuit 230 that the measured current is higher that the value displayed. Depressing or moving the lever of the switch to the other side informs processing circuit 230 that the measured current is lower than the value displayed. In other implementations, the user may inform processing circuit 230 of the measured value of current via a keypad. In other implementations, the user may inform processing circuit 230 of the measured value of current via the rotational position of a coded rotary switch or the position of a joystick, trackball, digital slide switch, or other conventional position sensing electrical/electronic components.

Knowing the magnitude of the current provided by power supply 340 and the magnitude of the capacitance of measurement capacitor CMT, processing circuit 230 may calculate an amount of time (e.g., period of time, duration of time) needed for a predetermined charge to be stored on measurement capacitor CMT by the current from power supply 340. In an implementation, the predetermined amount of charge is 63 microcoulombs. Preferably, each pulse of the stimulus signal provides the predetermined amount of charge per pulse. Factors that determine the predetermined amount of charge for impeding locomotion of a target include the number of pulse provided in a stimulus signal, the pulse rate, the pulse width, the pulse profile (e.g., shape), and time between pulses. The predetermined amount of charge may, taking the other factors of the stimulus signal into account, may fall in a range of 40 microcoulombs per pulse to 100 microcoulombs per pulse.

A pulse of a stimulus signal provides about the same amount of charge (e.g., close to) as the predetermined amount of charge when the pulse of the stimulus signal provides an amount of charge that is the predetermined amount of charge pulse or minus five percent (5%) of the predetermined amount of charge. For an implementation in which the predetermined amount of charge is 63 microcoulombs, a pulse of the stimulus signal provides about the same amount of charge as the predetermined amount of charge when the pulse provides between 63 microcoulombs minus five percent (e.g., 3.15 microcoulombs), which is 59.85 microcoulombs and 63 microcoulombs plus five percent (e.g., 3.15 microcoulombs), which is 66.15 microcoulombs. For an implementation in which the predetermined amount of charge is 100 microcoulombs, a pulse of the stimulus signal provides about the same amount of charge as the predetermined amount of charge when the pulse provides between 100 microcoulombs minus five percent (e.g., 5 microcoulombs), which is 95 microcoulombs and 100 microcoulombs plus five percent (e.g., 5 microcoulombs), which is 105 microcoulombs.

At the start of the calculated time period, processing circuit 230 opens switch Q1 so that all of the current from power supply 340 flows into and is stored on measurement capacitor CMT. At the end of the period of time, ADC 318 of processing circuit 230 samples the magnitude of the voltage across measurement capacitor CMT. At the time of sampling the voltage across measurement capacitor CMT, the amount of charge on measurement capacitor CMT is about the same as the predetermined amount of charge, so the sample, voltage is the golden voltage as discussed above. Further, processing circuit 230 knows that each time it measures the golden voltage across measurement capacitor CMT, the amount of charge on the measurement capacitor CMT is about the same as the predetermined amount of charge.

Figure 4:
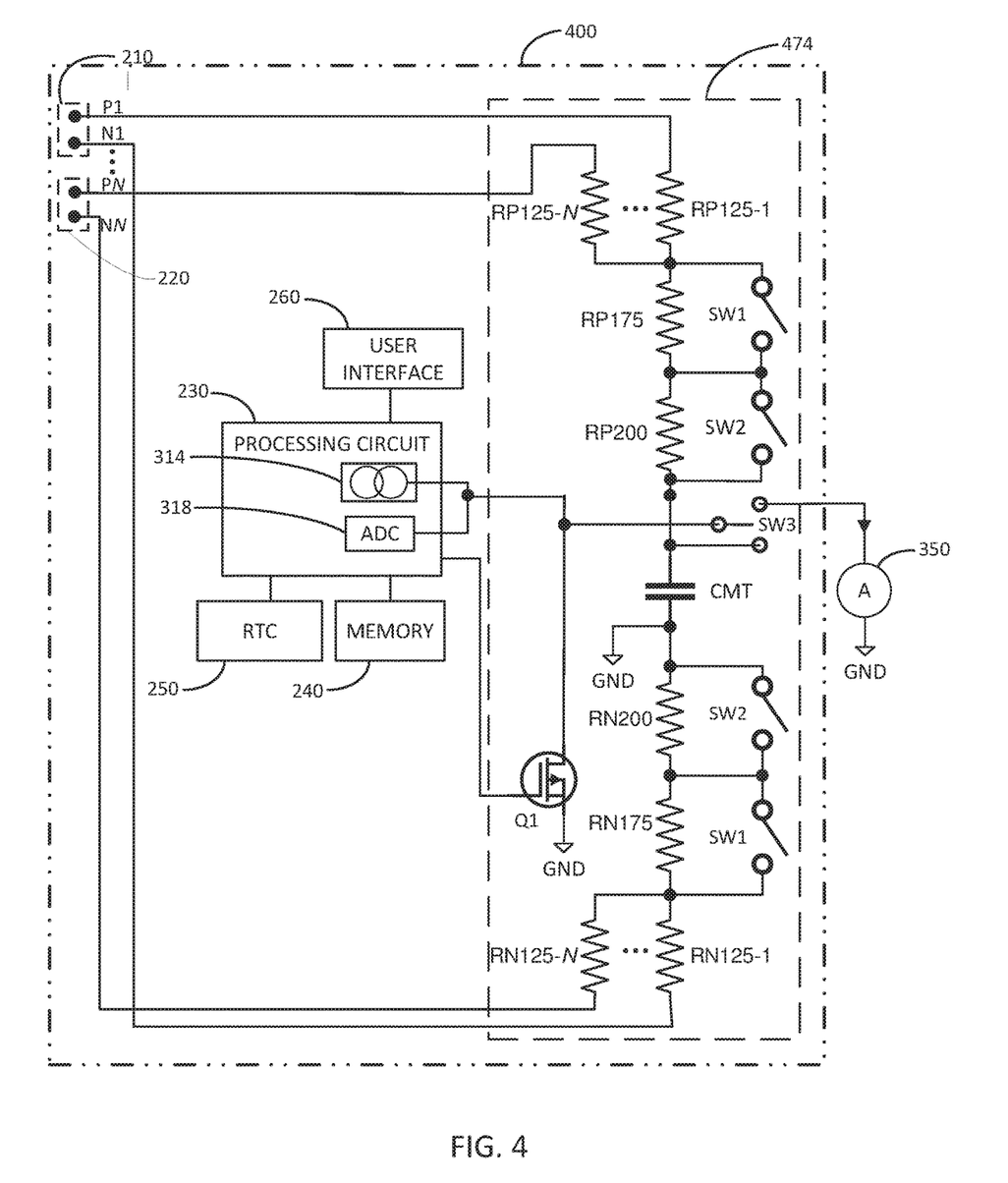
FIG. 4 is a diagram of another implementation of a portion of the test circuit of FIG. 2 and an ammeter for calibrating the tester.

In another implementation, shown in FIG. 4, current source 314 of processing circuit 230 provides a constant current for ISEM calibration. The charge from the constant current is stored on measurement capacitor CMT portion 400 of tester 200. Switch SW3 may be switched so that the current supplied by current source 314 flows through ammeter 350. Ammeter 350 measures and reports the magnitude of the current provided by current source 314. The user, as discussed above, reports the magnitude of the current from current source 314 to processing circuit 230 via the controls of user interface 260. Processing circuit 230 reports the value it has received from the user via the display on user interface 260. The user operates the up/down switches until the amount of current displayed by processing circuit 230 on user interface 260 is the same as the amount of current measured and reported by ammeter 350.

After the magnitude of the current from current source 314 has been measured by ammeter 350 and reported to processing circuit 230 via user interface 260, processing circuit 230 calculates the amount of time it will take to put the predetermined amount of charge on measurement capacitor CMT. Processing circuit 230, switches SW3 to direct the current from current source 314 to measurement capacitor CMT for the duration of the calculated time. At the end of the calculated period of time, ADC 318 of processing circuit 230 samples the voltage across measurement capacitor CMT. As discussed above, this voltage is the golden voltage because the charge stored on measurement capacitor CMT is about the same as the predetermined amount of charge. The value of the golden voltage is recorded by processing circuit 230 in memory 240.

In yet another implementation (not shown), current source 314 supplies a precise (e.g., typically within ±1% of nominal over the operating temperature range) constant current from processing circuit 230 to perform ISNM calibration. Since the magnitude of current is known, ammeter 350 and switch SW3 may be omitted. Since the magnitude of the current provided by current source 314 is known, the value may be stored in memory 240 so that processing circuit 230 knows the magnitude of current thereby eliminating the need for a user to enter the value through user interface 260. Processing circuit 230 may use the known amount of the current from current source 314 to calculate an amount of time needed to charge measurement capacitor CMT to the predetermined amount of charge. The golden voltage is measured, by ADC 318, upon reaching end of the calculated duration of time.

The three implementations discussed above provide methods for processing circuit 230 to determine a golden voltage that is related to the predetermined amount of charge, so that each time processing circuit 230 measures the golden voltage across measurement capacitor CMT, processing circuit 230 knows that the amount of charge on measurement capacitor CMT is about the same as the predetermined amount of charge.

Figure 5:
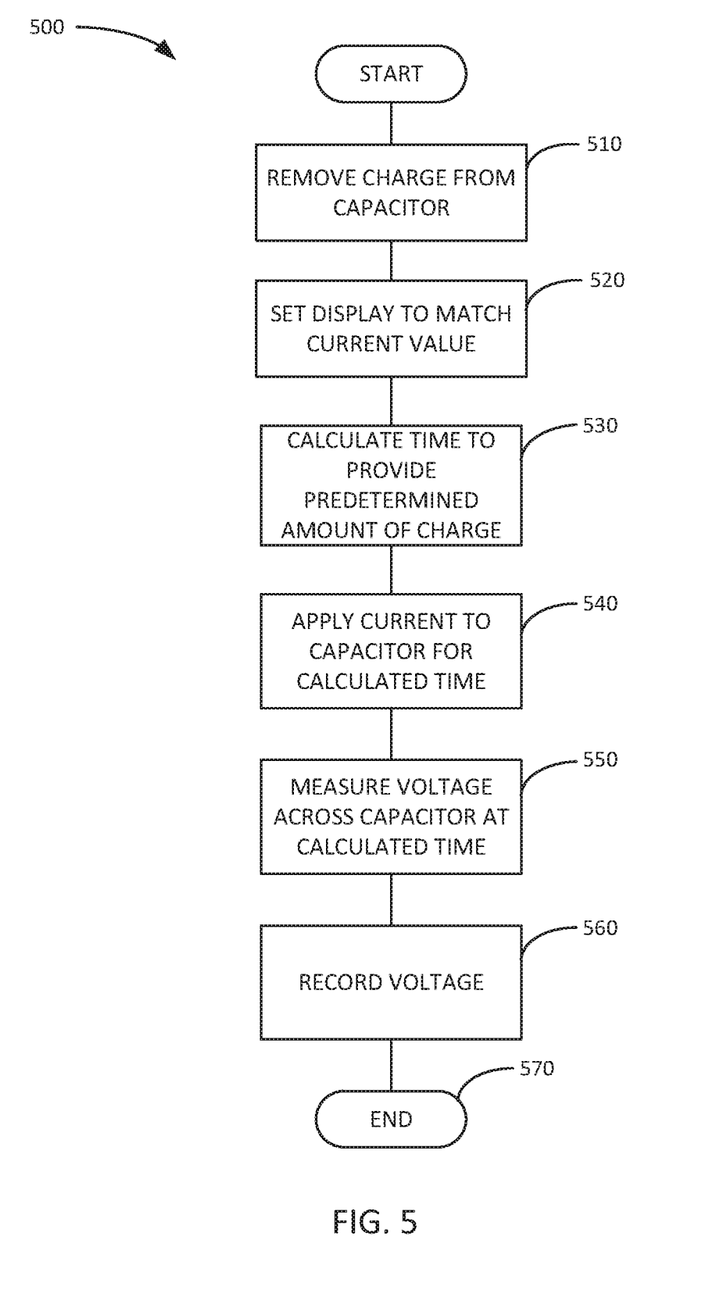
FIG. 5 is a flow chart of a method for external source with external measurement calibration of the tester of FIGS. 1 and 2 in preparation for calibration a CEW.

ESEM calibration method 500, shown in FIG. 5, is performed by tester 200 in cooperation with power supply 340 and ammeter 350 to determine the magnitude of the voltage (e.g., the golden voltage) across measurement capacitor CMT when measurement capacitor CMT stores an amount of charge that is about the same as the predetermined amount of charge. Method 500 includes remove charge 510, set display 520, calculate time 530, apply current 540, measure voltage 550, record voltage 560, and end 570.

In remove charge 510, processing circuit 230 removes (e.g., discharges, dumps) charge from measurement capacitor CMT by activating (e.g., closing, shorting) switch Q1. Removing the charge results in a zero-voltage differential across measurement capacitor CMT. When discharged, measurement capacitor CMT holds no charge or essentially no charge. Execution moves from remove charge 510 to set display 520.

In set display 520, ammeter 350 measures the current provided by power supply 340. A user, using the controls of user interface 260, sets the display of user interface 260 so that it shows the same value as the value of ammeter 350. Processing circuit 230 records the value as the magnitude of the current provided by power supply 340. Execution moves from set display 520 to calculate time 530.

In calculate time 530, processing circuit 230 calculates the amount of time needed for the current provided by power supply 340 to store the predetermined amount of charge on measurement capacitor CMT. For example, using equation no. 1 above, a current of 600 microamps supplied by power supply 340 provides 63 microcoulombs to measurement capacitor CMT in about 105 milliseconds. Execution moves from calculate time 530 to apply current 540.

In apply current 540, processing circuit 230 opens switch Q1 to allow measurement capacitor CMT to receive the current provided by power supply 340. Concurrently, processing circuit 230 reads (e.g., acquires, receives) the present time from RTC 250. Alternatively, processing circuit 230 may start a timer in RTC 250. Processing circuit 230 allows power supply 340 to provide the current to measurement capacitor CMT until the elapsed time reaches the time calculated in calculate time 530 or until the timer reaches (e.g., counts up to, counts down to) the calculated time. Upon reaching the time calculated, execution moves to measure voltage 550.

In measure voltage 550, processing circuit 230 detects (e.g., measures, samples) and records the magnitude of the voltage on measurement capacitor CMT. Processing circuit 230 may use a sample and hold circuit to sample the voltage. For example, processing circuit 230 may sample the voltage across measurement capacitor CMT and ADC 318 may convert the value of the sampled analog into a twelve-bit digital representation. The measured voltage is the golden voltage, which as discussed above, is the voltage across measurement capacitor CMT when the amount of charge stored by measurement capacitor CMT is about the same as the predetermined amount of charge. Execution proceeds to record voltage 560.

In record voltage 560, processing circuit 230 records the golden voltage to use in CEW testing and/or calibration. The golden voltage may be recorded in memory 240. Tester 200 now has a calibrated reference voltage that corresponds to a predetermined charge on measurement capacitor CMT. The use of the golden voltage compensates for variations in the capacitance of measurement capacitance CMT. Execution proceeds to end 570.

Figure 6:
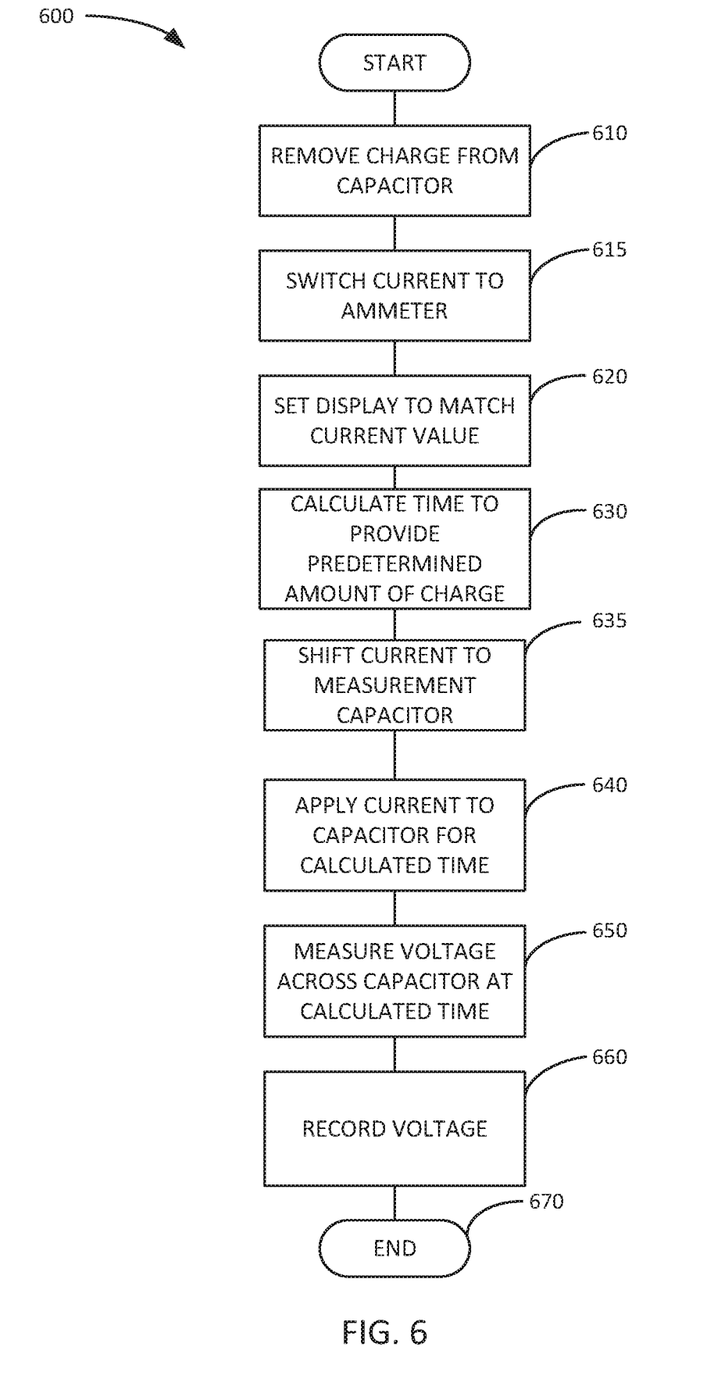
FIG. 6 is a flow chart of a method for internal source with external measurement calibration of the tester of FIGS. 1 and 2 in preparation for a calibration of a CEW.

ISEM calibration method 600, shown in FIG. 6, is performed by tester 200 in cooperation with ammeter 350 to determine the magnitude of the voltage across measurement capacitor CMT when measurement capacitor CMT stores an amount of charge that is about the same as the predetermined amount of charge. Method 600 includes remove charge 610, switch current 615, set display 620, calculate time 630, shift current 635, apply current 640, measure voltage 650, record voltage 660, and end 670.

In remove charge 610, processing circuit removes charge from measurement capacitor CMT as in remove charge 510. Execution moves from remove charge 610 to switch current 615.

In switch current 615, processing circuit 230 enables current source 314 to provide a constant current. Process circuit 230 concurrently enables switch SW3 to direct the current from current source 314 to ammeter 350. Alternatively, a user may actuate switch SW3, thus directing the current from current source 314 to ammeter 350. Execution moves from switch current 615 to set display 620.

In set display 620, ammeter 350 measures the current provided by current source 314. A user, using the controls of user interface 260, sets the display of user interface 260 so that it shows the same value as the value of ammeter 350, as in set display 520. Processing circuit 230 records the value as the magnitude of the current provided by current source 314. Execution moves from set display 620 to calculate time 630.

In calculate time 630, processing circuit 230 calculates the amount of time needed for the current provided by current source 314 to store the predetermined amount of charge on measurement capacitor CMT. Execution moves from calculate time 630 to shift current 625.

In shift current 635, processing circuit 230 directs switch SW3 to provide the current from current source 314 to measurement capacitor CMT. Alternatively, a user may actuate switch SW3 to direct the current from current source 314 to measurement capacitor CMT. Execution moves from shift current 635 to apply current 640.

In apply current 640, processing circuit 230 opens switch Q1 to allow measurement capacitor CMT to receive the current provided by current source 314. Concurrently, processing circuit 230 reads the present time from RTC 250, as in apply current 540. Alternatively, as in apply current 540, processing circuit 230 may start a timer in RTC 250. Processing circuit 230 allows current source 314 to provide the current to measurement capacitor CMT until the elapsed time reaches the time calculated in calculate time 630 or until the timer reaches (e.g., counts up to, counts down to) the calculated time. Upon reaching the time calculated, execution moves to measure voltage 650.

In measure voltage 650, processing circuit 230 detects and records the magnitude of the voltage on measurement capacitor CMT, as in measure voltage 550. The measured voltage is the golden voltage, which as discussed above, is the voltage across measurement capacitor CMT when the amount of charge stored by measurement capacitor CMT is about the same as the predetermined amount of charge. Execution proceeds to record voltage 660.

In record voltage 660, processing circuit 230 records the golden voltage to use in CEW testing and/or calibration, as in record voltage 560. The golden voltage may be recorded in memory 240. Tester 200 now has a calibrated reference voltage that corresponds to a predetermined charge on measurement capacitor CMT. The use of the golden voltage compensates for variations in the capacitance of measurement capacitance CMT. Execution proceeds to end 670.

After performing calibration by method 500 or method 600, tester 200 may periodically check its calibration by using a current source internal to tester 200. This method of verifying the calibration of tester 200 is referred to as calibration verification. Calibration verification may be considered part of the normal operation (e.g., testing of CEWs by a user) of tester 200. For example, calibration verification may be repeated after every n number of CEW tests, where n is an integer greater than or equal to one. Calibration verification may be repeated each time tester 120 is powered on. Calibration verification may be repeated according to a set schedule (e.g., hourly, daily, weekly). Calibration verification may be repeated using any combination of these intervals.

Figure 7:
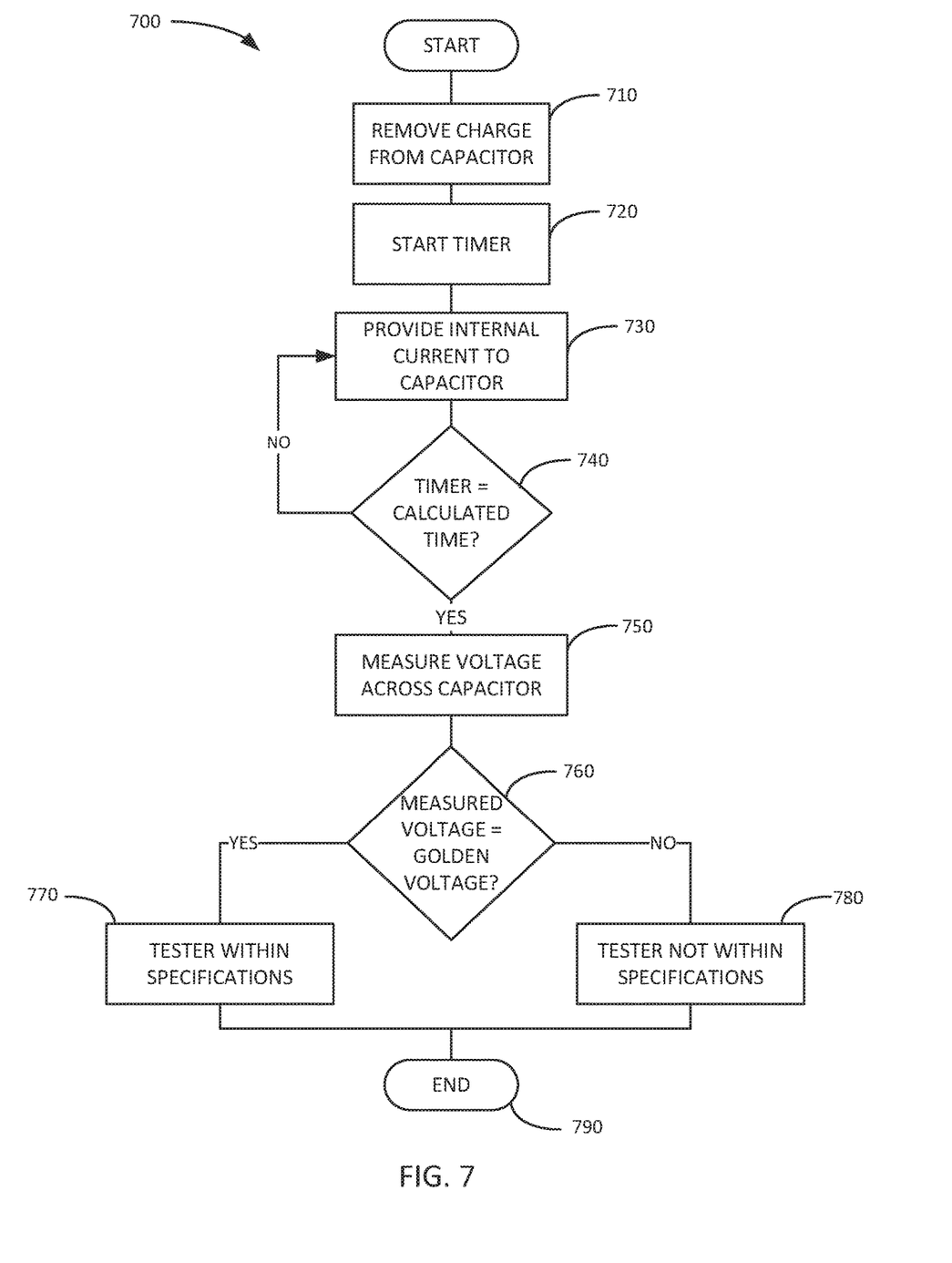
FIG. 7 is a flow chart of a method for calibration verification of the tester of FIGS. 1 and 2 in preparation for calibrating a CEW.

In calibration verification, calibration is checked using current source 314 of processing circuit 230. Method 700, shown in FIG. 7, is performed by the tester. Method 700 includes remove charge 710, start timer 720, provide current 730, timer 740, measure voltage 750, golden voltage 760, within spec 770, not within spec 780, and end 790.

In remove charge 710, processing circuit 230 removes any charge from measurement capacitor CMT as described in remove charge 510. Execution moves from to start timer 720.

In start timer 720, processing circuit 230 reads the present time from RTC 250 or initiates a timer in RTC 250. Concurrently with start timer 720, the method may proceed to process provide current 730.

In provide current 730, processing circuit 230 provides a current from current source 314 to measurement capacitor CMT. The magnitude of the current is constant and set or known by processing circuit 230. Processing circuit 230 calculates the time needed for the predetermined amount charge to accumulate on measurement capacitor CMT. Execution proceeds to timer 740.

In timer 740, processing circuit 230 cooperates with RTC 250 to determine when the calculated time has elapsed. Processing circuit 230 may poll the present time from RTC 250 and compute the elapsed time. A timer in RTC 250 may signal (e.g., interrupt, message) processing circuit 230 that the calculated time has elapsed. If the calculated time has not elapsed, the execution loops back to provide current 730 and timer 740. When the calculated time has elapsed, the execution proceeds to measure voltage 750.

In measure voltage 750, processing circuit 230 samples the voltage across measurement capacitor CMT as described in measure voltage 550. The voltage across measurement capacitor CMT is the voltage when the predetermine amount of charge is stored on measurement capacitor CMT. Once the voltage has been sampled, execution proceeds to golden voltage 760.

In golden voltage 760, processing circuit 230 compares the sampled voltage from measure voltage 750 with the recorded golden voltage. If the difference in magnitude between the voltages is within a threshold, execution proceeds to within spec 770. If the difference in magnitude of the two voltages exceeds a threshold, execution proceeds to not within spec 780. For example, in an implementation, the predetermined charge on measurement capacitor CMT is 63 microcoulombs±5% as discussed above. The corresponding voltage on a 47-microfarad capacitor is 1.34 volts according to equation no. 2 above. A ±5% tolerance on the predetermined charge corresponds to a ±5% tolerance on the golden voltage and results in a threshold of 1.273 volts to 1.407 volts, or 1.34±0.067 volts.

In within spec 770, processing circuit 230 logs the results in memory 240. The log may include the date, time, measured voltage, and other information about the calibration verification. The results of the calibration verification may be presented to the user through user interface 260. Execution proceeds to end 790.

In not within spec 780, processing circuit 230 logs the results in memory 240. The log may include the date, time, measured voltage, and other information about the calibration verification. The results of the calibration verification may be made available to the user through user interface 260. Processing circuit 230 may provide alerts or warnings informing the user that tester 120 is not operating within specifications. Processing circuit 230 may disable tester 120 from performing CEW testing if the magnitude of the measured voltage exceeds the golden voltage by an unacceptable amount. Execution proceeds to end 790.

As described above, the determination of the golden voltage depends on an accurate and stable clock in RTC 250. In method 800, shown in FIG. 8, the drift in the time provided by RTC 250 is checked to determine whether RTC 250 is within a threshold (typically 1 second of drift per month). Method 800 includes display time 810, get time 820, time difference 830, confirmation 840, instruct 850, error 860, halt 870, and end 880.

Figure 8:
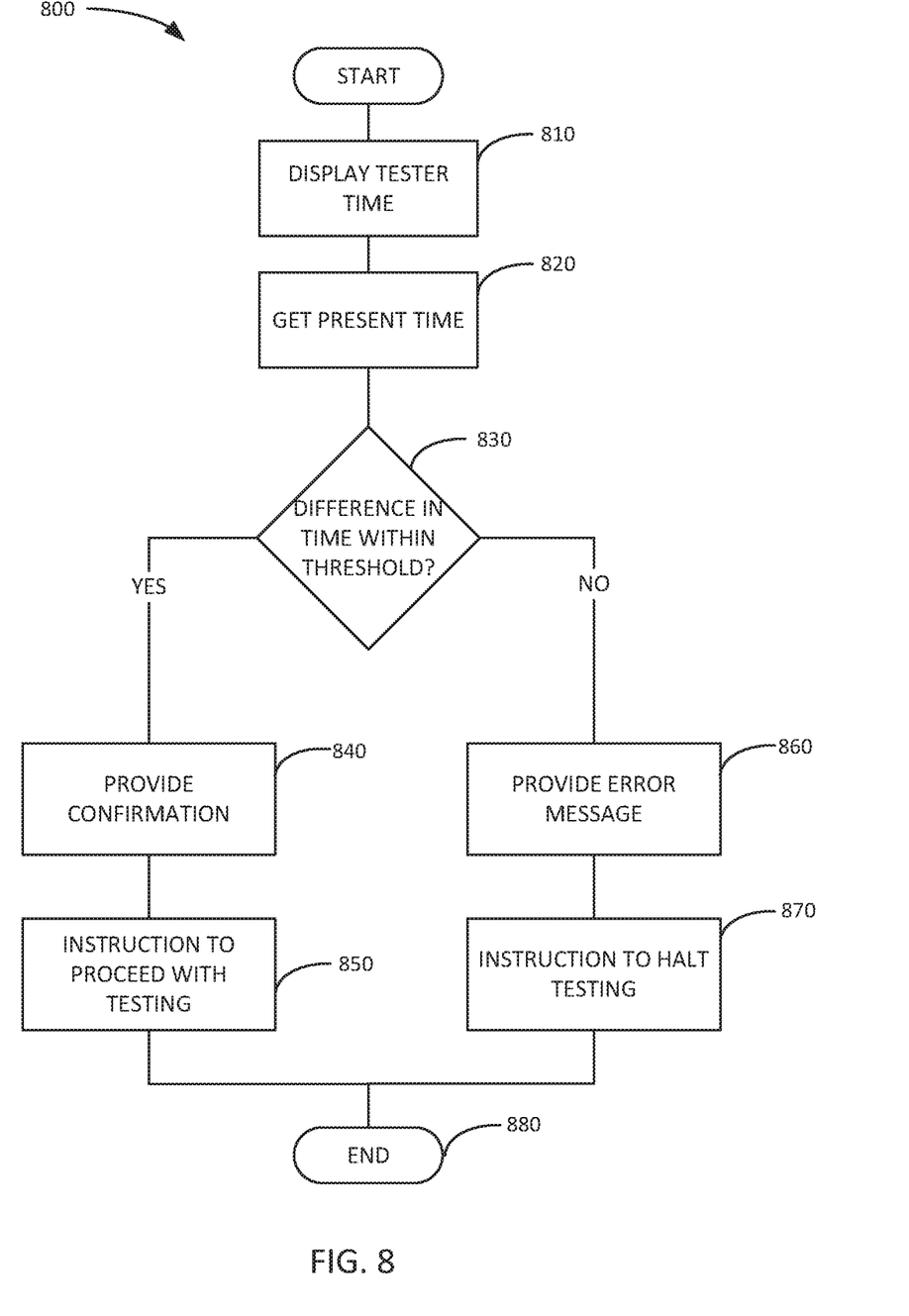
FIG. 8 is a flow chart of a method for checking the drift of a real-time clock of the tester of FIGS. 1 and 2.

In display time 810, processing circuit 230 is instructed through user interface 260 to display the present time tracked by RTC 250. The display will typically include the hours, minutes, and seconds of the time as measured by RTC 250. Execution proceeds to get time 820.

In get time 820, a user obtains the present time from a different source. For example, the user may obtain the present value of UTC time. UTC time may be obtained via the internet, radio broadcasts, and navigation systems (e.g., GPS) after applying a correction. Upon obtaining the present UTC time, execution proceeds to time difference 830.

In time difference 830, a user compares the present UTC with the displayed present time from RTC 250. If the time difference is within a threshold, execution proceeds to confirmation 840. If the time difference is greater than the threshold, execution proceeds to error 860.

In confirmation 840, a user informs processing circuit 230, through user interface 260 that RTC 250 is within tolerance. The accuracy of RTC 250 is confirmed indicating that the time has not drifted beyond an acceptable amount. Execution proceeds to instruct 850.

In instruct 850, processing circuit 230 logs the confirmation that RTC 250 is within tolerance. The log may include the date and time the confirmation is recorded. Processing circuit 230 may also provide a confirmation to a user through user interface 260. Execution proceeds to end 880.

If time difference 830 results in a time threshold being exceeded, execution proceeds to error 860. In error 860, processing circuit 230 logs an error message in memory 240 and proceeds to halt 870. Processing circuit 230 may also provide user a message regarding the error via user interface 260.

In halt 870, processing circuit 230 may disable further calibration of tester 200. Processing circuit 230 may indicate to a user, through user interface 260, that the tester is no longer within specification. Processing circuit 230 may also provide an alert that the tester needs servicing. Execution proceeds to end 880.

The foregoing description discusses preferred embodiments of the present invention, which may be changed or modified without departing from the scope of the present invention as defined in the claims. Examples listed in parentheses may be used in the alternative or in any practical combination. As used in the specification and claims, the words 'comprising', 'comprises', 'including', 'includes', 'having', and 'has' introduce an open ended statement of component structures and/or functions. In the specification and claims, the words 'a' and 'an' are used as indefinite articles meaning 'one or more'. When a descriptive phrase includes a series of nouns and/or adjectives, each successive word is intended to modify the entire combination of words preceding it. For example, a black dog house is intended to mean a house for a black dog. While for the sake of clarity of description, several specific embodiments of the invention have been described, the scope of the invention is intended to be measured by the claims as set forth below. In the claims, the term "provided" is used to definitively identify an object that not a claimed element of the invention but an object that performs the function of a workpiece that cooperates with the claimed invention. For example, in the claim "an apparatus for aiming a provided barrel, the apparatus comprising: a housing, the barrel positioned in the housing", the barrel is not a claimed element of the apparatus, but an object that cooperates with the "housing" of the "apparatus" by being positioned in the "housing". The invention includes any practical combination of the structures and methods disclosed. While for the sake of clarity of description several specifics embodiments of the invention have been described, the scope of the invention is intended to be measured by the claims as set forth below.

The location indicators "herein", "hereunder", "above", "below", or other word that refer to a location, whether specific or general, in the specification shall be construed to refer to any location in the specification where the location is before or after the location indicator.

What is claimed is:

1. A system for calibrating a tester, the tester for measuring an amount of charge provided by a handle of a conducted electrical weapon ("CEW"), the system comprising:
    a digital multimeter, the digital multimeter for measuring electrical properties;
    a first current source, the first current source for providing a first current having a constant magnitude; and
    the tester, the tester includes a processing circuit, and a capacitor; wherein:
        the digital multimeter measures the constant magnitude of the first current;
        the processing circuit receives a report of the constant magnitude of the first current as measured by the digital multimeter;
        the processing circuit receives information regarding a magnitude of a capacitance of the capacitor;
        in accordance with the constant magnitude of the first current and the magnitude of the capacitance of the capacitor, the processing circuit determines a duration of time for the first current to provide a predetermined amount of charge to the capacitor;
        the first current source provides the first current for the duration of time to charge the capacitor with the predetermined amount of charge; and
        the processing circuit measures a magnitude of a first voltage across the capacitor after expiry of the duration of time.

2. The system of claim 1 wherein:
    the tester further comprises a user interface; and
    a user reports the constant magnitude of the first current to the processing circuit via the user interface.

3. The system of claim 1 wherein the processing circuit discharges the capacitor prior to the duration of time.

4. The system of claim 1 wherein the predetermined amount of charge is 63 microcoulombs, ±5%.

5. The system of claim 1 wherein the capacitor is within a range of from 44 microfarads to 47 microfarads.

6. The system of claim 1 wherein the tester further includes an analog-to-digital converter to measure the first voltage.

7. The system of claim 1 wherein:
the tester further includes a memory; and
the processing circuit records the magnitude of the first voltage in the memory.

8. The system of claim 1 wherein:
the tester further includes a real-time clock; and
the real-time clock measures the duration of time.

9. A system for calibrating a tester, the tester for measuring an amount of charge provided by a handle of a conducted electrical weapon ("CEW"), the system comprising:
a digital multimeter; and
the tester, the tester includes a processing circuit, a current source, and a capacitor, the current source provides a current having a constant magnitude; wherein:
the digital multimeter measures the constant magnitude of the current provided by the current source;
the processing circuit determines a duration of time for the current source to provide a predetermined amount of charge to the capacitor;
the current source provides the current for the duration of time to charge the capacitor with the predetermined amount of charge; and
the processing circuit measures a voltage across the capacitor after expiry of the duration of time.

10. The system of claim 9 wherein:
the tester further comprises a user interface; and
a user reports the constant magnitude of the current to the processing circuit via the user interface.

11. The system of claim 9 wherein the processing circuit discharges the capacitor prior to the duration of time.

12. The system of claim 9 wherein the predetermined amount of charge is 63 microcoulombs, ±5%.

13. The system of claim 9 wherein the capacitor is substantially within a range of from 44 microfarads to 47 microfarads.

14. The system of claim 9 wherein the tester further includes an analog-to-digital converter to measure the voltage.

15. The system of claim 9 wherein:
the tester further includes a memory; and
the processing circuit records the voltage in the memory.

16. The system of claim 9 wherein:
the tester further includes a real-time clock; and
the real-time clock measures the duration of time.

* * * * *